United States Patent [19]

Vollenbroek et al.

[11] Patent Number: 4,937,176
[45] Date of Patent: Jun. 26, 1990

[54] METHOD OF MANUFACTURING A SEMICONDUCTOR DEVICE, IN WHICH A NEGATIVE IMAGE IS FORMED ON A SEMICONDUCTOR SUBSTRATE IN A POSITIVE PHOTOLACQUER

[75] Inventors: Franciscus A. Vollenbroek; Wilhelmus P. M. Nijssen; Marcellinus J. H. J. Geomini, all of Eindhoven, Netherlands

[73] Assignee: U.S. Philips Corporation, New York, N.Y.

[21] Appl. No.: 251,003

[22] Filed: Sep. 27, 1988

Related U.S. Application Data

[63] Continuation of Ser. No. 37,479, Apr. 13, 1987, abandoned.

[30] Foreign Application Priority Data

Apr. 29, 1986 [NL] Netherlands .......................... 8601096

[51] Int. Cl.$^5$ .............................................. G03F 7/26
[52] U.S. Cl. .................................... 430/325; 430/141; 430/145; 430/147; 430/148; 430/191; 430/192; 430/170; 430/311; 430/270; 430/330
[58] Field of Search ............... 430/311, 325, 145, 147, 430/148, 191, 192, 330, 141, 170, 270

[56] References Cited

U.S. PATENT DOCUMENTS

| | | | |
|---|---|---|---|
| 1,760,780 | 5/1930 | Schmidt et al. | 430/172 |
| 4,055,425 | 10/1977 | Mustacchi | 430/147 |
| 4,160,671 | 7/1979 | Stahlhofen | 430/191 |
| 4,350,753 | 9/1982 | Shelnut et al. | 430/191 |
| 4,356,254 | 10/1982 | Takahashi et al. | 430/191 |
| 4,458,000 | 7/1984 | Stahlhofen | 430/191 |
| 4,546,066 | 10/1985 | Field et al. | 430/323 |
| 4,704,347 | 11/1987 | Vollenbrock et al. | 430/156 |

OTHER PUBLICATIONS

Willson, C. G. et al., "Organic Resist Materials—Theory and Chemistry", Am. Chem. Soc., 1983, pp. 111–123.
Kosar, J., "Light-Sensitive Systems", J. Wiley & Sons, 1965, pp. 267–269.
Landau R., *The Journal of Photographic Science*, vol. 13, 1965, pp. 144–151.
MacIntyre, M. W. et al., IBM Technical Disclosure Bulletin, vol. 14, No. 10, March, 1972, p. 2878.
Pompalone, T. R. et al., "Improving Linewidth Control Over Reflective Surfaces Using Heavily Dyed Photoresists", *Solid State Science & Technology*, vol. 133, No. 1, pp. 192–195, Jan., 1986.

Primary Examiner—Charles L. Bowers, Jr.
Attorney, Agent, or Firm—Norman N. Spain

[57] ABSTRACT

A method of manufacturing a semiconductor device, in which a layer of photolacquer (5) containing as a photoactive component a diazo oxide is provided on a semiconductor substrate. Of this layer, parts (9) are irradiated by a first patterned irradiation (7) and these parts are then rendered poorly developable by an intermediate treatment. Subsequently, the lacquer layer (5) is subjected to a second non-patterned irradiation (11) and is then developed. According to the invention, in the parts (9) irradiated by the first irradiation a pigment is formed, which absorbs radiation having a wavelength at which diazo oxide is photosensitive. The second irradiation is carried out with radiation of that wavelength. Thus, lacquer tracks having a rectangular profile can be obtained in a simple manner.

5 Claims, 2 Drawing Sheets

METHOD OF MANUFACTURING A SEMICONDUCTOR DEVICE, IN WHICH A NEGATIVE IMAGE IS FORMED ON A SEMICONDUCTOR SUBSTRATE IN A POSITIVE PHOTOLACQUER

This is a continuation of application Ser. No. 037,479, filed Apr. 13, 1987, abandoned.

BACKGROUND OF THE INVENTION

The invention relates to a method of manufacturing a semiconductor device, in which layer of photolacquer is formed on a semiconductor substrate, which layer contains as a photoactive component a diazo oxide and parts of which layer are irradiated by a first patterned irradiation, these irradiated parts then bring rendered poorly developable by an intermediate treatment, after which the lacquer layer is subjected to a second non-patterned irradiation and is then developed.

A photolacquer containing a diazo oxide as a photoactive component is a "positive" photolacquer because the parts thereof irradiated during a patterned irradiation are soluble in a developer. In the method mentioned in the opening paragraph, these irradiated parts of the photolacquer layer are again rendered poorly developable during the intermediate treatment so that they are not soluable or only very slowly soluble in a developer. After the second irradiation, the parts of the photolacquer layer not irradiated during the first irradiation are dissolved in a developer. The parts irradiated during the first irradiation then remain. Thus, a "negative" image is formed in the "positive" photolacquer layer.

It has been found that in the manner described above—also designated as image reversal —, lacquer tracks having very different profiles can be formed in a photolacquer layer. For example, tracks may be formed which are narrower at their bottoms tops than at their, while tracks may be formed which are wider at their tops than at their bottoms, and also tracks which at their tops must have the same width as at their bottoms. Especially the the last possibility renders this method particularly suitable for manufacturing semiconductor devices comprising a semiconductor substrate having a surface which is not flat, but which has a stepped topography. A photolacquer layer formed on such a surface will exhibit differences in thickness because lacquer has the tendency to form a layer having a flat surface. Above steps the photolacquer layer will be thinner than beside the steps on the surface of such semiconductor substrate. With the use of a pattern of lacquer tracks having a rectangular cross-section as a mask, a corresponding pattern of conductors can be etched into a conductive layer present on such a surface without undesired restrictions or shortcircuits being formed in these conductors.

From Proceedings of the International Conference on Microlithography "Microcircuit Engineering 84", 25-29Sept. 1984, pp.555-559 a method is known of the kind mentioned in the opening paragraph, in which the intermediate treatment that is carried is a thermal treatment. During the first patterned irradiation, indene carboxylic acid formed from diazo oxide present is then decarboxylated. This decarboxyation is catalysed by an organic base, such as imidazol, added the photolacquer. Thus, the parts of the photolacquer layer irradiated during the first irradiation are rendered poorly developable.

It has been found in practice that it is difficult to obtain the desired lacquer profiles have the same width at their tops as at their bottoms. Especially the time of development and the concentration of lye in the developer should be chosen with great care. If, for example, the time of development is too short, lacquer profiles are formed which are narrower at their tops than at their feet; if the time of development is too long, lacquer profiles are formed which are wider at their tops than at their feet. If the photolacquer is developed in a developer having a non-optimized lye concentration, lacquer profiles can be obtained, however, which have the same width at their tops as at their feet, but their width then deviates from the width of the part of the photolacquer irradiated during the first irradiation.

SUMMARY OF THE INVENTION

The invention has inter alia for its object to provide a method in which in a less critical manner photolacquer patterns having a substantially rectangular profile can be formed on a semiconductor substrate.

According to the invention, the method of the kind mentioned in the opening paragraph is for this purpose characterized in that in the parts of the photolacquer layer irradiated by the first irradiation a pigment is formed which absorbs radiation having a wavelength in a wavelength range in which diazo oxide is photosensitive, and in that the second irradiation is carried out with radiation of that wavelength.

During the first patterned irradiation, parts of the photolacquer layer at in which lacquer tracks have to be formed are irradiated, whereas the remaing part of the layer is not irradiated. In the irradiated parts on the upper side of the layer a larger quantity of radiation is received than on the lower side of the layer so that in the irradiated parts a larger quantity of diazo oxide is therefore consumed on the upper side of the layer than on the lower side of the layer. Without the pigment-forming step according to the invention, after the intermediate treatment the conditions are such that in the irradiated parts diazo oxide is still left on the lower side of the layer, while on the upper side of the layer radiation will be absorbed less strongly than in the non-irradiated parts. During the second irradiation, the quantity of converted diazo oxide on the lower side of the parts irradiated during the first irradiation is equally large as or larger than that on the lower side of the parts of the photolacquer layer not irradiated during the first irradiation. The developability of photolacquer depends upon the quantity of diazo oxide converted during the second irradiation. On the lower side of the parts irradiated during the first irradiation, the photolacquer layer can therefore be dissolved in the developer as readily as or more readily than on the lower side of the parts not irradiated during the first irradiation. As a result, during the development, a lacquer profile can readily be formed, which is wider at its top than at its bottom, as a result of which it is more difficult to obtain rectangular profiles. Due to the step according to the invention, because a pigment is formed in the parts irradiated by the first irradiation, the conversion of diazo oxide during the second irradiation in these parts of the photolacquer layer is counteracted. Thus, it becomes more difficult to form a lacquer profile which is wider at its top than at its foot. Rectangular profile can therefore be obtained in a less critical manner.

DETAILED DESCRIPTION OF THE INVENTION

Figure 1:
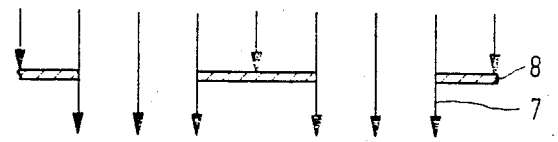
FIGS. 1 to 4 are diagrammatic views showing stages of the manufacture of a semiconductor device according to the method of the invention.
Figure 1:
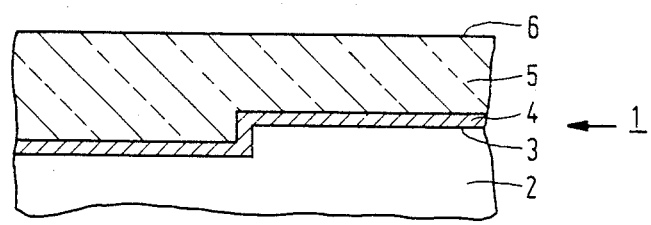
Figure 2:
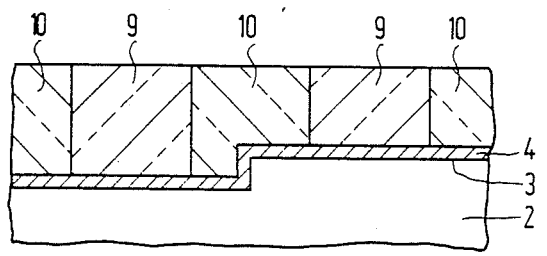
Figure 3:
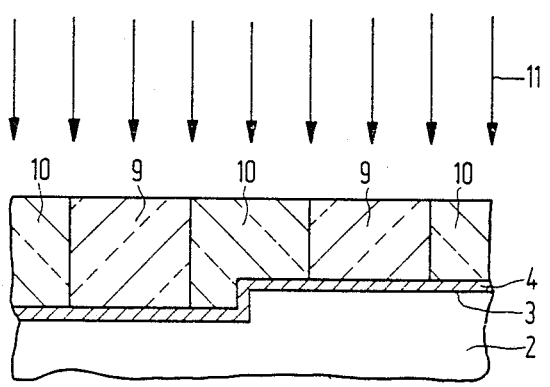
Figure 4:
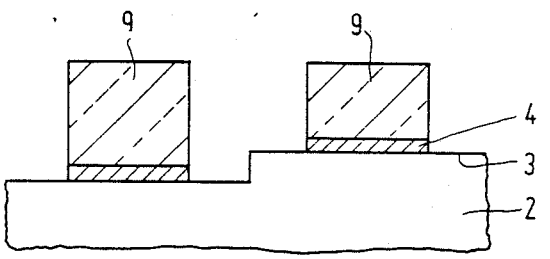

The invention will now be described in greater detail with reference to the figures of the drawing and the following examples.

Preferably, the method according to the invention is characterized in that to the photolacquer a substance is added which under the influence of an acid formed during the first patterned irradiation can form a diazonium compound. More particularly, during the first patterned irradiation, diazo oxide is converted in the then irradiated parts into indene carboxylic acid. Under the influence of this acid, the substance added to the photolacquer can form the diazonium compound. This diazonium compound can in turn react with the indene carbonic acid to form an azo pigment. The indene carboxylic acid then has the function of a coupler. By the addition of a single substance, the desired pigment can be thus be formed.

The intermediate treatment can be carried out as a simple thermal treatment if the substance added to the photolaquer is a triazene compound. At a temperature of about 110° C., not only can the desired pigment then be formed, but also a reaction occurs, as a result of which the parts of the photolacquer layer irradiated by the first irradiation become poorly developable.

A further preferred embodiment of the method according to the invention is characterized in that there is further added to the photolacquer a photochemical acidifier which under the influence of the first patterned irradiation forms a strong acid particularly one much stronger than indene carboxylic acid. As a result during the first irradiation, an acid is formed which is much stronger than indene carboxylic acid. This has the advantage that a triazene compound can be used, which under the influence of a strong acid forms a diazonium compound, but under the influence of a weak acid does not form such a compound. Since photolacquer forms a weakly acid medium due to phenolic OH groups present therein, the photolacquer containing such a triazene compound becomes in itsself a more stable lacquer system than a photolacquer containing a triazene compound which forms a diazonium compound under the influence of a weak acid. It has been found that stable lacquer systems can be obtained with conventional photolacquers which are composed on the basis of comparatively weakly acid novolaks. With the use of a less stable lacquer system, the possibility of formation of the pigment in the parts not irradiated during the first irradiation is comparatively large, while after the second irradiation has been carried out, the solubility in developer can then also be lower.

A very practical photochemical acidifier which is readily soluble in photolacquer is a halogen-containing triazene derivative.

The diazonium compound formed in the parts of the photolacquer layer irradiated during the first irradiation can couple with the indene carboxylic acid also formed there to form an azo pigment. Preferably, however, an additional coupler is also added to the photolacquer. As a result, it can be achieved that not only can a stronger absorption in the parts of the photolacquer layer irradiated by the first irradiation be obtained, but also that the maximum absorption of the pigment takes place at a wavelength at which diazo oxide has a maximum sensitivity, Moreover, a photolacquer can be used in which an indene carboxylic acid is formed which is a real coupler, as is the case in certain photolacquer containing a diazo oxide having a maximum photosensitivity to radiation having the wavelength of the I-line in the Hg spectrum.

A very practical coupler readily soluble in photolacquer is resorcinol.

FIGS. 1 to 4 shohw diagrammatically in cross-section a few relevant stages of manufacture of a semiconductor device 1, in which there is provided on a semiconductor substrate 2, in this case a semiconductor substrate 2 having a surface 3 exhibiting a stepped topography and provided with a conductive layer 4 of, for example, aluminum, a layer of photolacquer 5, which contains a diazo oxide as a photoactive component. Such a photolacquer layer is provided in practice while the substrate 2 is rapidly rotated. Thus, a photolacquer layer 5 having a comparatively flat surface 6 is obtained. The photolacquer layer 5 therefore exhibits differences in thickness.

By a first patterned irradiation—indicated diagrammatically by arrows 7—a mask 8 is imaged on the photolacquer layer 5. The parts 9 of the photolacquer layer 5 irradiated, while the parts 10 of the photolacquer layer 5 do not receive radiation. In the parts 9, the diazo oxide is converted into indene carboxylic acid, whereas this is not the case in the parts 10. Thus, the parts 9 becomes soluble in a developer. If the photolacquer should now be developed, the parts 9 would be dissolved and the parts 10 would not be dissolved. Thus, a positive image of the mask 8 would be formed in the photolacquer layer 5. Such a photolacquer is designated as "positive".

During a next intermediate treatment, however, the parts 9 are again rendered poorly developable so that they are not dissolved or are dissolved only slowly in a developer. Subsequently, the photolacquer layer 5 is subjected to a second non-patterned irradiation—indicated diagrammatically by arrow 11. During this second irradiation, in the parts 10 of the photolacquer layer 5 the diazo oxide is converted into indene carboxylic acid so that these parts now become soluble in a developer. After the second irradiation, the photolacquer layer 5 is developed, the parts 10 of the layer 5 then being removed, while the parts 9 are maintained. Thus, in the layer of "positive" photolacquer 5 a "negative" image of the mask 8 is formed.

The lacquer tracks 9 thus formed in the photolacquer layer can now be used to etch a corresponcing pattern of conductors into the conductive layer 4.

Figure 5:
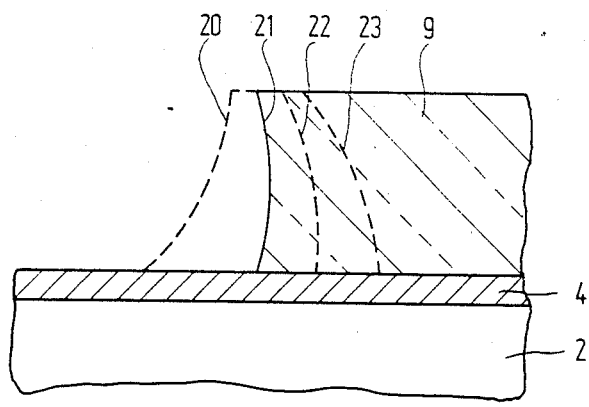
FIG. 5 shows diagrammatically a sectional view of a number of lacquer profiles obtained according to the method of the invention at successive development times.

It has been found that by the methol described —also designated as image reversal—lacquer tracks 9 can be formed which have greatly different profiles. FIG. 5 shows one side of the lacquer track 9. In the same developer, the lacquer track has at successive instants of development profiles designated by reference numerals 20, 21, 22 and 23. After a development for a comparatively short time, the lacquer track 9 has a profile 20, whose width at the top is smaller than that at the foot. After development for a longer time, a profile 21 is obtained, whose width at the top is substantially equal to that at the bottom. After an even longer time of development, the profile 22 and then the profile 23 are obtained, whose width at the top is larger than that at the bottom. It will be clear that the profile 21 is the best approximation of the ideal lacquer profile. With a carefully chosen developer, the width of the lacquer track 9 having the rectangular profile 21 is just equal to the width defined by the mask 8.

According to the invention, in the parts 9 of the photolacquer layer 5 irradiated by the first patterned irradiation 7 a pigment is formed, which pigment absorbs radiation having a wavelength in a wavelength range in which diazo oxide is photosensitive, while the second non-patterned irradiation 11 is carried out with radiation of that wavelength. By this measure it is achieved that in a not very critical manner lacquer tracks 9 having a substantially rectangular profile can be formed. It has been found that the difference in time of development to form lacquer tracks having the profiles 21 and 22 indicated in FIG. 5 is comparatively great. It has further been found that the lye concentration of any lye present in the developer has a comparatively small influence in the formation of rectangular lacquer profiles.

The fact that by means of the method according to the invention desired rectangular lacquer profiles can be obtained in a not very critical manner is based on the following recognition. During the first irradiation 7, the parts 9 of the photolacquer layer 5 are irradiated and the parts 10 thereof are not irradiated. Due to radiation absorption in the photolacquer layer 5, a larger quantity of radiation is received on the upper side of the parts 9 than on the lower side of these parts so that on the upper side also a larger quantity of diazo oxide is consumed than on the lower side. Without the measure according to the invention, after the intermediate treatment diazo oxide is still left on the lower side of the parts 9, while less radiation will be absorbed on the upper side of the parts 9 than on the upper side of the parts 10. During the second irradiation 11, on the lower side of the parts 9 the converted quantity of diazo oxide is equally large as or larger than on the lower side of the parts 10. The solubility in the developer can therefore also be higher on the lower side of the parts 9 than on the lower side of the parts 10. Consequently, during development, a lacquer track having a profile as indicated by 22 in FIG. 5 can readily be formed. Since through the measure of the invention ,a pigment is formed the parts 9 of the photolacquer layer 5, radiation is absorbed during the second irradiation 11 in these parts 9. The conversion of diazo oxide and hence the solubility in a developer on the lower side of the parts 9 will therefore be small. As a result, rectangular lacquer profiles can be formed in a less critical manner.

Preferably, according to the invention, a substance is added to the photolacquer which under the influence of an acid formed during the first irradiation can form a diazonium compound. Under the influence of the indene carboxylic acid formed from diazo oxide during the first irradiation such a substance forms a diazonium compound, which then also couples with the indene carboxylic acid to form an azo pigment. Thus, only a single substance need be added to the photolacquer to obtain the desired pigment.

When the substance added a triazene compound is added, the desired pigment can be formed by carrying out the intermediate treatment as a thermal treatment at a temperature of about 110° C. A reaction then also occurs, as a result of which the irradiated parts become poorly soluble.

Furthermore, the photolacquer has preferably also added to it a photochemical acidifier, which forms a strong acid under the influence of the first patterned irradiation. This has the advantage that a triazene compound can be used, which forms a diazonium compound under the influence of a strong acid, but which does not form such a compound under the influence of a weak acid. Since a photolacquer forms a weakly acid medium, a photolacquer containing such a triazene compound constitutes a more stable lacquer system than a photolacquer containing a triazene compound which forms a diazonium compound under the influence of a weaker acid. It has been found that stable lacquer systems can be obtained with conventional photolacquers which are composed on the basis of comparatively acid novolak. With the use of such a less stable lacquer system, the possibility of formation of pigment in the parts not irradiated during the first irradiation 7 is comparatively large, while the solubility of the parts 10 would then also be lower after the first irradiation.

Preferably, a further additional coupler is added to the photolacquer, which, when coupled to the diazonium compound, yields the azo pigment. By addition of the additional coupler, it can be achieved that a stronger absorption can be obtained in the parts 9 of the photolacquer layer 5 than if indene carboxylic acid is utilized as a coupler, but also that absorption takes place at a wavelength at which diazo oxide has a maximum radiation sensitivity. Moreover, photolacquers can be used in which an indene carboxylic acid is formed, which is a bad coupler, as is the case with photolacquers containing a diazo oxide having a maximum photosensitivity to radiation having a wavelength of the I-line in the Hg spectrum.

When a triazene compound from the group of compounds having the chemical formula

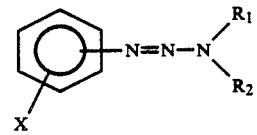

in which X=H, 2-Me-5 Cl, 2-Me-4 Cl, 4-Cl, 4-Br in which $R_1=R_2=CH_3$, $CH_2—CH_2—OH$ or in which $R_1R_2=—CH_2—CH_{22}—CH_2—CH_2$, $—CH_2—CH_2—O—CH_2—CH_2—$ is added, lacquer profiles having a rectangular cross-section can readily be obtained.

EXAMPLE 1

To a photolacquer marketed by Shipley (of the type N 42306) (on the basis of polyvinylphenol containing diazo nanhthoquinone as photoactive component) there were added 100 mgs of 1-phenyl-3-morpholino-triazene per 2 gms of photolacquer. The mixture was agitated for about 1 hour and filtered through a 0.2 μm filter and applied to a number of silicon slices having a thickness of about 1.4 μm, which were rotated at a speed of 5000 revolutions per minute. Subsequently, the layer was dried for about 30 minutes at 50° C.

The patterned irradiation was carried out with an irradiation apparatus of Perkin-Elmer (of the type 300), a mask with gaps having a width of 2 μm at a relative distance of 2 μm being imaged on the photolacquer layer. The intermediate treatment was a thermal treatment at 105° C. for about 30 minutes. The seconnd irradiation was carried out with an HPA 400W lamp of Philips through a filter transparent to radiation having a wavelength of 435 nm. The slices thus treated were developed in a developer of Shipley (type N 43604 CD 17), of which 50 cm³ were added to 100 cm³ of water.

Figure 6:
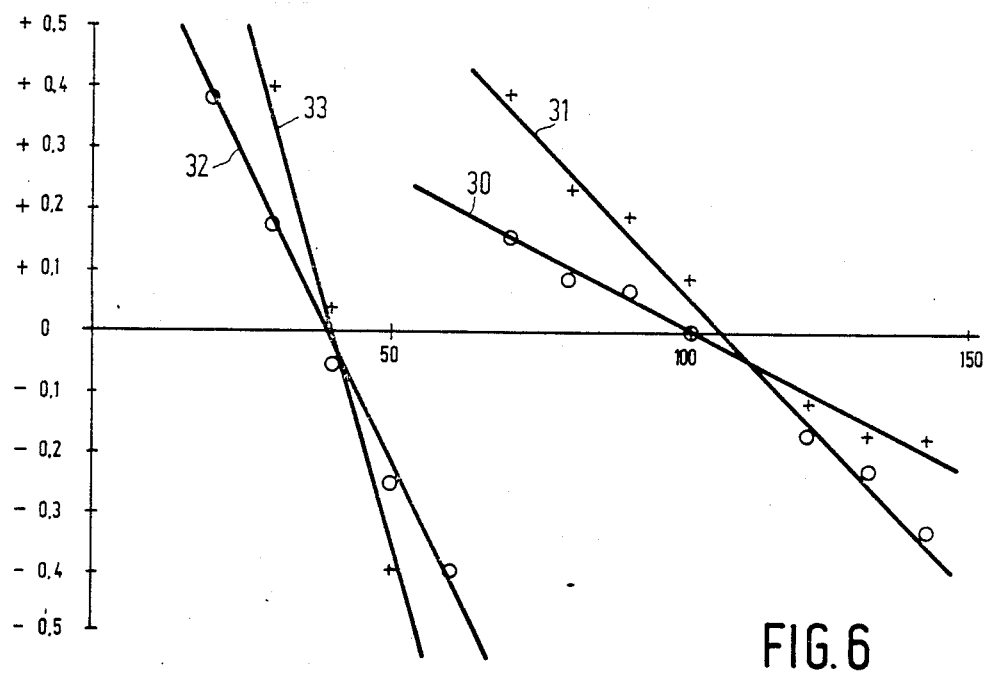
FIG. 6 is a graph showing the differences between the desired width and the actual widths of the lacquer profiles obtained by the method of the invention, at their feet and at their tops, as a function of the development time.

SEM photographs were taken of lacquer profiles thus manufactured, on which the width of the lacquer profiles was measured. In FIG. 6 the difference between these widths and the mask width is plotted against the time (in seconds) for which the slices were developed. The curves 30 and 31 show the differences in width measured at the tops and at the bottoms, respectively, of the lacquer profiles. For comparison, the curves 32 and 33 show the differences in width measured at the tops and the bottoms, respectively, of the lacquer profiles obtained in the same manner in the same photolacquer, but without the addition of the triazene. In this case, image reversal was obtained by carrying out the thermal treatment at 105° C. in ammonium vapour. It appears from FIG. 6 that a method in which use is made in accordance with the invention of a pigment formed in the parts of the photolacquer layer irradiated during the first irradiation the development time is much less critical than in a method in which this is not the case. In order to obtain a lacquer profile having a width deviating at most 0.2 μm from the desired width, with the use of the method according to the invention the time of development should be chosen in an interval of 85 to 125 seconds, while without the measure according to the invention this time should be chosen in an interval of 35 to 45 seconds.

EXAMPLE II

To a photolacquer of Shipley (type N42306) there were added 80 mgs of 1-phenyl-3-dimethyl aminotriazene. The exposure and the intermediate treatment were carried out in the same manner as in Example I. The layer of photolacquer was developed in developer N43704 CD 17 of Shipley. Results were obtained which were comparable with those in Example I.

Upon addition of a photochemical acidifier to the photolacquer, preferably a halogen-containing triazene derivative, a strong acid is formed during the first irradiation in the then irradiated parts of the photolacquer layer. Preferably, the halogen-containing triazene derivative is a compound from the group of compounds having the chemical formula

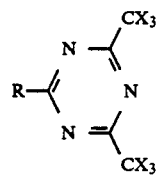

in which X=Cl, Br, and in which

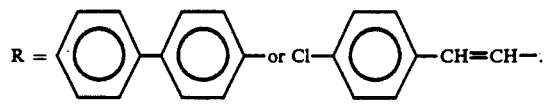

EXAMPLE III

To photolacquer of Shipley (Type N 42306) there were added per 2 gms of photolacquer 140 mgs of 1-(4-bromophenyl)-3-morpholinotriazene and as acidifier 60 mgs of 2,6-biphenylyl-4,6-bis-trichloromethyl-S-triazine. The exposure and the intermediate treatment were carried out in the same manner as in Example I. The photolacquer layer was developed in developer of Shipley (type N43704 CD 17). Also in this case results were obtained corresponding to those in Example I.

Upon addition of an additional coupler, preferably one from the group of compounds comprising resorcinol, β-naphthol and N,N-dimethyl analine, a stronger absorption can be realized in the parts irradiated during the first irradiation at a wavelength at which diazo oxide has a maximum photosensitivity.

EXAMPLE IV

For each 2 gms of photolacquer (N 42306) of Shipley 140 mgs of 1-(4-bromophenyl)-3-morpholino triazene, 60 mgs of 2,6-biphenylyl-4,6-bis-trichloromethyl-S-triazine as acidifier and 40 mgs of resorcinol as coupler were added. The photolacquer was developed in developer N 43704 CD 17 marketed by Shipley. Also in this case results were obtained corresponding to those in Example I.

EXAMPLE V

For each 2 gms of AZ 214 photolacquer of Shipley, a so-called I-line photolacquer, 120 mgs of 1(4-chlorophenyl)-3-morpholino triazene, 60 mgs of 2,6-biphenylyl-4,6-bis-trichloromethyl-S-triazine and 30 mgs of resorcinol were added. The exposure and the intermediate treatment were carried out in the same manner as in Example I. The photolacquer was developed in AZ 400K developer of Shipley. The results correspond to those of Example I.

EXAMPLE VI

For each 2 gms of HPR 204 photolacquer of Hunt (a photolacquer on the basis of novolak) 120 mgs of 1-(4-chlorophenyl)-3-morpholino triazene, 60 mgs of 2,6-biphenylyl-4,6-bis-triohloromethyl-S-triazine and 30 gms of resorcinol were added. The exposure and the intermediate treatment were carried out in the same manner as in Example I. The photolacquer was developed in LS1 developer of Hunt. The results corresponded to those in Example I.

What is claimed is:

1. A method of providing a semiconductor substrate with a patterned photolacquer layer having a substantially rectangular profile, said method substrate comprising:
   (a) Providing a semiconductor substrate with a photolacquer layer containing a photoactive diazo oxide compound capable of being converted to an indene carboxylic acid, a triazene compound capable of reacting with an acid to form a diazonium compound capable of reacting with a coupler to form an azo pigment which absorbs radiation having a wavelength range in which said diazo oxide compound is photosensitive, said triazene compound being of the formula

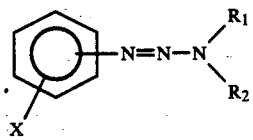

in which X=H, 2-Me-5-Cl, 2-Me-4Cl or 4-Br and in which $R_1=R_2=CH_3$, $CH_2-CH_2-OH$ or in which $R_1R_2=-CH_2-CH_2-CH_2-CH_2-CH_2$ or $-CH_2-CH_2-O-CH_2-CH_2-$, and a photochemical acidifier which under the influence of the first patterned irradiation forms a strong acid, said acidifier being a halogen-containing triazine compound;

(b) exposing said layer to a first patterned irradiation;

(c) then heating said thus irradiated layer to thereby cause said azo pigment to form in the irradiated portions of said layer and cause said irradiated portions of said layer to become only poorly developable;

(d) exposing said thus first-irradiated layer to a second non-patterned irradiation of a wavelength absorbed by said pigment and to which diazo oxide compound is photosensitive; and (e) developing said layer to thereby remove the portions of said layer non-irradiated during said first irradiation.

2. A method as claimed in claim 1, characterized in that the halogen-containing triazene derivative is a compound selected from the group of compounds having the chemcial formula:

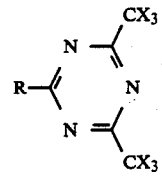

in which X=Cl or Br and in which

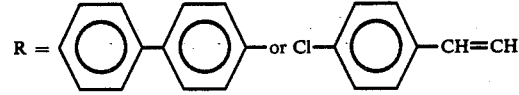

3. A method as claimed in claim 1, characterized in that an additional coupler is further added to the photolacquer.

4. A method as claimed in claim 3, characterized in that the additional coupler is a compound from the group of compounds consisting of resorcinol, β-naphthanol and N,N-dimethylaniline.

5. A method as claimed in claim 1, wherein the photolacquer layer additinally contains a novolak or a polyvinyl phenol.

* * * * *